United States Patent
Krishnamoorthy et al.

(10) Patent No.: US 7,816,793 B2
(45) Date of Patent: Oct. 19, 2010

(54) APPARATUS FOR FACILITATING PROXIMITY COMMUNICATION BETWEEN CHIPS

(75) Inventors: Ashok V. Krishnamoorthy, San Diego, CA (US); John E. Cunningham, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 12/391,137

(22) Filed: Feb. 23, 2009

(65) Prior Publication Data

US 2009/0179334 A1 Jul. 16, 2009

Related U.S. Application Data

(62) Division of application No. 11/385,430, filed on Mar. 20, 2006, now Pat. No. 7,514,289.

(51) Int. Cl.
*H01L 21/00* (2006.01)
*H01L 21/44* (2006.01)
*H01L 23/48* (2006.01)

(52) U.S. Cl. .................. 257/777; 257/619; 257/621; 257/622; 257/698; 257/778; 257/E21.122; 257/E21.514; 257/E21.515; 257/E23.01; 257/E23.098; 438/108; 438/109; 438/110

(58) Field of Classification Search ............... 257/619, 257/621, 622, 698, 777, 778, E21.122, E21.514, 257/E21.515, E23.01, E23.098, E23.171; 438/108, 109, 110; *H01L 21/00, 21/44, 23/02, H01L 23/48*
See application file for complete search history.

(56) References Cited

U.S. PATENT DOCUMENTS

| | | | |
|---|---|---|---|
| 6,400,008 B1 * | 6/2002 | Farnworth | 257/698 |
| 6,555,917 B1 | 4/2003 | Heo | |
| 7,067,910 B2 * | 6/2006 | Drost et al. | 257/686 |
| 7,276,780 B2 * | 10/2007 | Dotta et al. | 257/621 |
| 7,355,273 B2 * | 4/2008 | Jackson et al. | 257/686 |
| 2007/0043894 A1 | 2/2007 | Zingher | |

* cited by examiner

*Primary Examiner*—Dao H Nguyen
(74) *Attorney, Agent, or Firm*—Park, Vaughan & Fleming LLP

(57) ABSTRACT

One embodiment of the present invention provides a system for facilitating proximity communication between semiconductor chips. The system includes a base chip and a bridge chip, each of which includes an active face upon which active circuitry and signal pads reside, and a back face opposite the active face. The active face of the bridge chip is bonded to the active face of the base chip. Then, an identified portion of the active face of the bridge chip is thinned via etching and is removed by planarizing the back face of the bridge chip, thereby creating an opening in the bridge chip that exposes a portion of the active face of the base chip.

9 Claims, 4 Drawing Sheets

APPARATUS FOR FACILITATING PROXIMITY COMMUNICATION BETWEEN CHIPS

RELATED APPLICATIONS

This application is a divisional application of, and hereby claims priority under 35 U.S.C. §120 to, application Ser. No. 11/385,430, titled "Methods and Structures for Facilitating Proximity Communication," by inventors A. Krishnamoorthy and J. Cunningham, filed 20 Mar. 2006.

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention generally relates to semiconductor integrated circuits. More specifically, the present invention relates to methods and structures for facilitating proximity communication between semiconductor chips.

2. Related Art

Conductive electrical interconnections and transceivers facilitate reliable communications between integrated circuit (IC) chips. Because of packaging and manufacturing advantages, conductive interconnections typically dominate the interconnect hierarchy within computer systems. However, decreasing semiconductor line-widths and increasing on-chip clock speeds are putting pressure on the ability of traditional resistive wires to achieve the off-chip bandwidths necessary to fully utilize on-chip computational resources.

A new technique referred to as "proximity communication" overcomes the limitations of resistive wires by using capacitive coupling to provide communications between chips that are oriented face-to-face. This capacitive coupling can provide signal densities two orders of magnitude denser than traditional off-chip communication using wire-bonding or traditional ball-bonding, while the circuits and coupling structures remain fully-compatible with standard CMOS foundries. To communicate off-chip through capacitive coupling, on-chip circuits drive a high-impedance, capacitive transmitter pad. Such communication avoids impedance conversion and thereby reduces the power normally dissipated by off-chip driver circuits. Moreover, simple driver circuits and small chip-to-chip distances can significantly reduce the total chip-to-chip communication latency.

While proximity communication provides off-chip signaling bandwidth that scales with chip feature size, it also introduces topological constraints. The active sides of chips typically need to face each other with full or partial overlap, so that corresponding transmitter and receiver pads on opposing chips align both laterally and vertically. Since the strength of the capacitively-coupled signal voltage on a receiver pad is inversely proportional to the distance between the receiver pad and a corresponding transmitter pad, maintaining a minimal vertical "z-separation" is important for successful communication. However, achieving and maintaining such alignment and proximity is difficult, especially when working with rigid, noncompliant chips that typically experience large temperature variations during operation.

Hence, what is needed are structures and methods that facilitate inter-chip alignment for proximity communication without the limitations of existing approaches.

SUMMARY

One embodiment of the present invention provides a system for facilitating proximity communication between semiconductor chips. The system includes a base chip and a bridge chip, each of which includes an active face upon which active circuitry and signal pads reside, and a back face opposite the active face. The active face of the bridge chip is bonded to the active face of the base chip. Then, an identified portion of the active face of the bridge chip is thinned via etching and is removed by planarizing the back face of the bridge chip, thereby creating an opening in the bridge chip that exposes a portion of the active face of the base chip.

In a variation on this embodiment, the back face of the bridge chip is planarized after the bridge chip is bonded to the base chip.

In a further variation, the back face of the bridge chip is planarized before the bridge chip is bonded to the base chip.

In a further variation, the active face of the base chip communicates with a third device through the opening in the bridge chip.

In a further variation, the active face of the base chip receives power and ground through the opening in the bridge chip and optionally communicates with other devices through the opening, for instance using a solder bump array, an optical fiber, a rigid-flex cable, a ceramic substrate, an organic substrate, and/or a silicon substrate.

In a further variation, the planarization of the back face of the base chip increases the compliance of the portion of the bridge chip used for proximity communication.

In further variation, a pit etched in the bridge chip facilitates alignment with a neighboring chip for proximity communication.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs), DVDs (digital versatile discs or digital video discs), or any device capable of storing data usable by a computer system.

Proximity Communication

Figure 1:
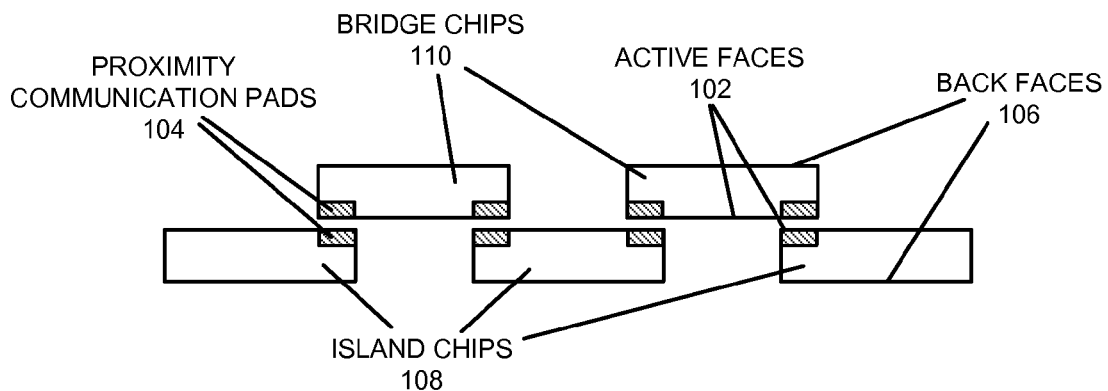
FIG. 1 illustrates an array of chips communicating using proximity communication in accordance with an embodiment of the present invention.

Proximity communication overcomes the limitations of resistive wires by communicating through capacitive coupling between chips that are placed face-to-face. As shown in FIG. 1, for an array of chips communicating through proximity communication, the active faces 102 of the chips typically face each other with full or partial overlap, with the corresponding proximity communication pads 104 on opposing chips aligned both laterally and vertically. The back faces 106 of chips are also labeled for clarity.

In one embodiment of the present invention, the lower chips in FIG. 1 are referred to as "island chips" 108, and the upper chips are referred to as "bridge chips" 110. In such an arrangement, the bridge chips 110 have less active circuitry and power consumption and serve primarily to connect two or more island chips together.

To enhance proximity communication between neighboring island chips, the island chips and corresponding bridge chips are precisely aligned both laterally as well as axially (e.g. in the z-direction) to enable reliable signal transfer between chips. Previous methods typically rely on rigid, non-compliant bridge and island chips that are difficult to align in large arrays. Thinning the bridge chips achieves flexibility but is sub-optimal because the resulting chips may be difficult to handle and may be less reliable. The present invention overcomes these and other drawbacks by providing a structure and method of manufacture for a bridge chip that achieves a precisely defined, predetermined amount of compliance or flexibility.

Compliant Bridge Chips

Creating compliant bridge chips for proximity communication presents a set of difficulties. While a thin bridge chip provides compliance, bridge chips are typically conductively bonded to one or more island chips for power. To simplify the handling of the bridge chips, bridge chips can be permanently attached to an island chip, for instance using a flip-chip process with solder bumps that provides permanent conductive channels between the bridge chip and the island chip. The bridge chip, now permanently attached to the first island chip and remateably attached to a second island chip, provides interconnection between the two island chips.

Unfortunately, while the thinning of semiconductor wafers is a known process, bonding thin chips can be challenging. For instance, silicon circuits are routinely thinned after fabrication to reduce the substrate thickness and improve electrical and thermal characteristics of the packaged chips. While these techniques can be used to create compliant bridge chips, handling and especially flip-chip bonding the thin wafers can be substantially difficult. Such difficulty is especially common for wafers that have been thinned to the point where they exhibit some physical compliance (i.e. flexible wafers).

Existing bonding techniques "flip-chip bond" one semiconductor chip onto another, and then remove the substrate of the second chip. This technique enables the flip-chip bonding of chips of different materials (e.g. GaAs onto Silicon, or InP onto Silicon), but can be generalized to attach arbitrary chips. The present invention teaches a method that allows a compliant bridge chip with arbitrary flexibility to be created and to then be permanently attached to an island chip. Furthermore, the method enables a "cutout" section to be defined so that flexibility can be imparted to a pre-determined sub-sectional region of the bridge chip. Such a configuration can impart flexibility to only the desired portion(s) of the bridge chip that extend between the corresponding islands.

Figure 2:
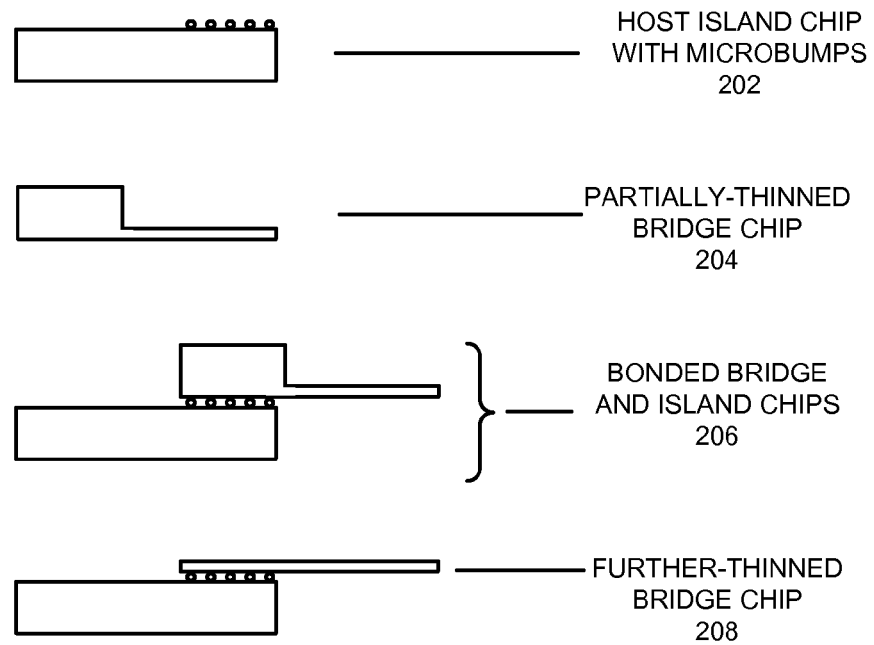
FIG. 2 illustrates the formation and scaling of a two-layer stack of chips in a planar configuration in accordance with an embodiment of the present invention.
Figure 4:
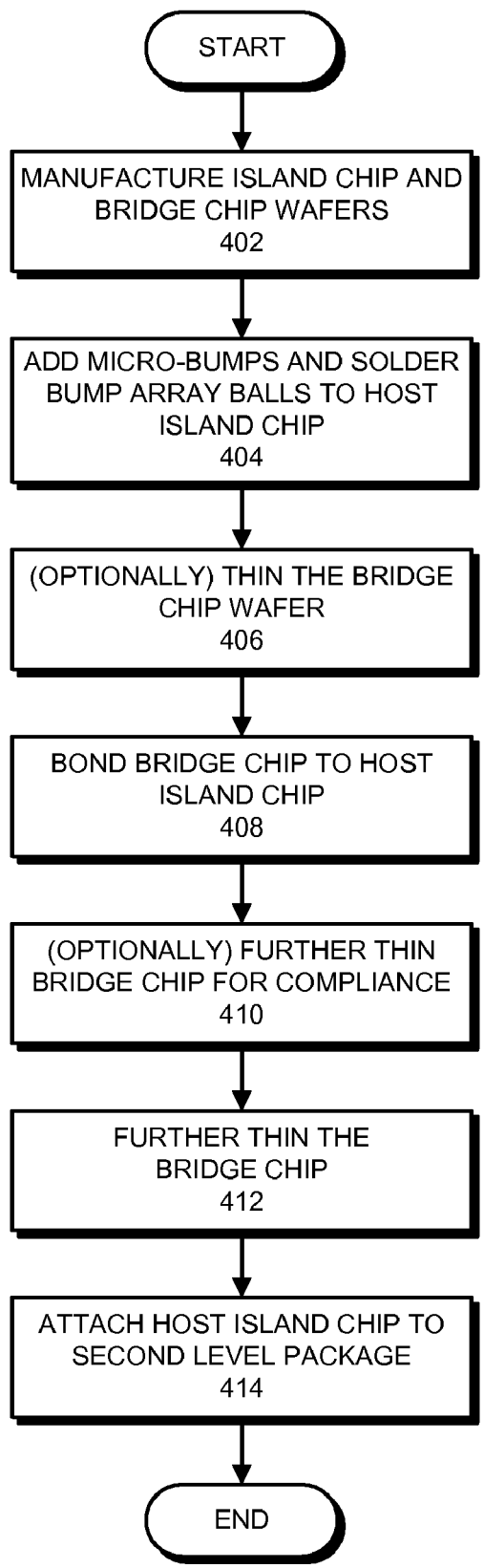
FIG. 4 presents a flow chart illustrating the process of creating a compliant island-bridge chip in accordance with an embodiment of the present invention.

FIG. 4 presents a flow chart illustrating one embodiment of the process for creating a compliant island-bridge chip, while FIG. 2 illustrates how a two-layer stack of chips can be formed and scaled in a planar configuration. The first step is to manufacture a set of island chips and bridge chips (step 402). Next, the host island chip is prepared for subsequent flip-chip bonding by adding micro solder-bumps 202 (and possibly solder-bump balls, as described later) (step 404). This can be accomplished using a photolithographic technique at the wafer level that operates on multiple island chips in parallel.

The bridge chip then undergoes an optional initial round of thinning, resulting in a partially-thinned bridge chip 204 (step 406). This optional thinning operation achieves a predetermined amount of flexibility in the bridge chip that allows the compliant sections of the bridge chip to be formed at the wafer level. Thinning portions of multiple bridge chips in parallel reduces the cost associated with individual chip thinning, while still enabling the rigid sections of the resulting thinned and sawed individual bridge chips to be easily handled and flip-chip bonded to corresponding island chips via a thermo-compression bonding procedure.

Figure 3:
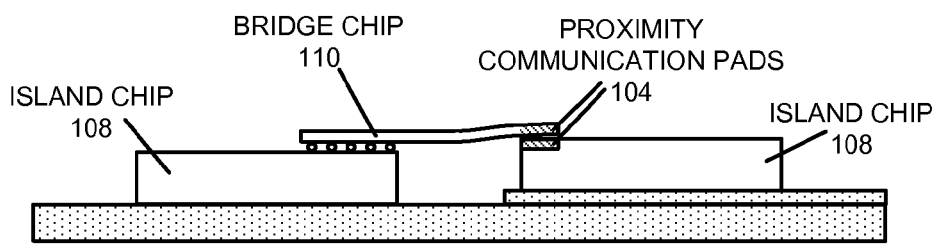
FIG. 3 illustrates a compliant bridge chip in accordance with an embodiment of the present invention.

After the optional thinning, the bridge chip is bonded to the host island chip 206 to establish mechanical and electrical contact between the chips (step 408). The bridge chip can then be further thinned for compliance 208 (step 412). FIG. 3 illustrates a compliant bridge chip and how the compliance can compensate for dynamic mechanical perturbations and chip height differences associated with non-planar multi-chip packages. The resulting compliant, flip-chip bonded island-bridge chip combination can be tiled to form two-dimensional bridge chip structures for proximity communication.

Note that the thinning of the bridge chips may be accomplished by a physical process, a chemical process, or some optimal combination of both physical and chemical techniques, depending on the desired accuracy and control of the final thickness and the desired thinning rate. Note also that the thinning of the substrate can benefit the performance of proximity communication circuitry by reducing parasitic capacitance.

Removing Etched Portions of Bridge Chips

In one embodiment of the present invention, portions of the bridge chip wafer are identified for removal, and the area on the active face of the chip that corresponds to the areas to be removed is etched during manufacture. Etching can include, but is not limited to, wet etching, which removes material by immersing the wafer in a liquid bath of chemical etchant, and dry etching, which typically removes material by exposing the wafer to a bombardment of ions. Note that only a relatively thin portion of the top of the chip might be etched (e.g. 100 microns); the etching does not need to go completely through the wafer. Then, either before or after being bonded to an island chip, the back face of the bridge chip is thinned. Since the etched portions of the active face have essentially thinned the portions of the bridge chip to be removed, the subsequent thinning of the back face removes the identified portions while leaving the un-etched portion thin and compliant, as desired.

Figure 5A:
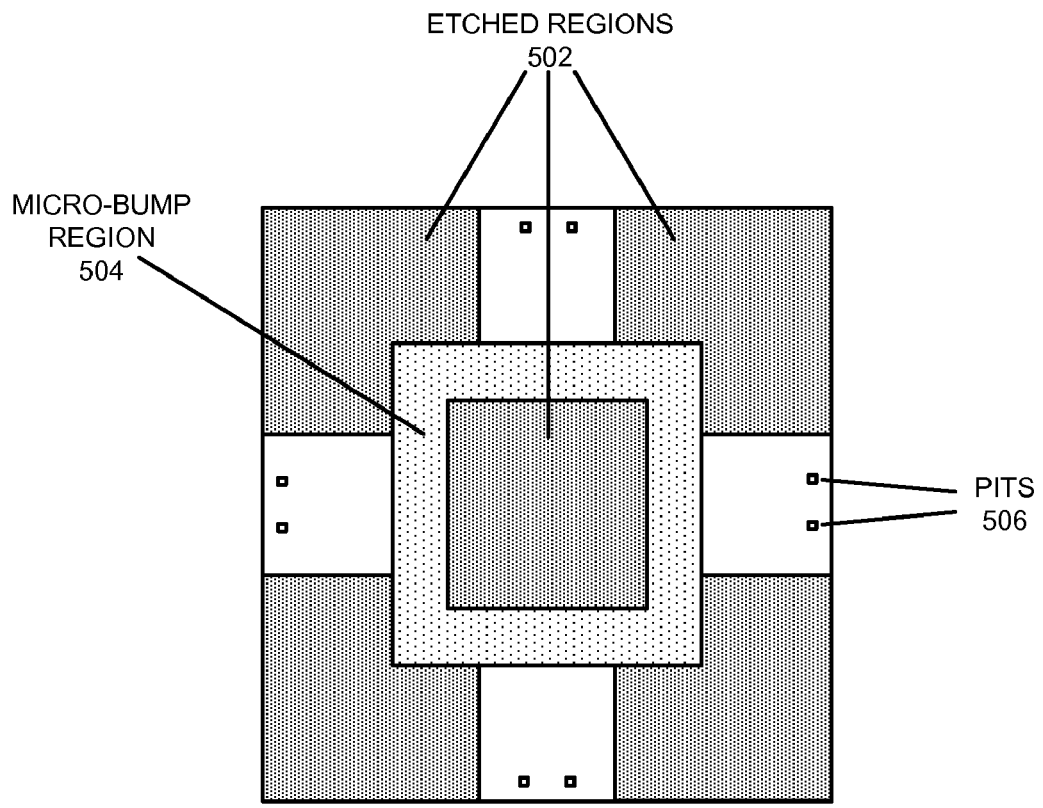
FIG. 5A illustrates the active face of a bridge chip with etched regions to be removed in accordance with an embodiment of the present invention.

FIG. 5A illustrates the active face of a bridge chip with etched regions 502 to be removed. The bridge chip begins as a full chip. The region with micro-bumps 504 indicates where the bridge chip will be bonded to an island chip. Etched pits 506 created during the manufacturing process aid in the alignment and coupling of the proximity communication pads of the bridge chip with the pads of neighboring island chips.

Figure 5B:
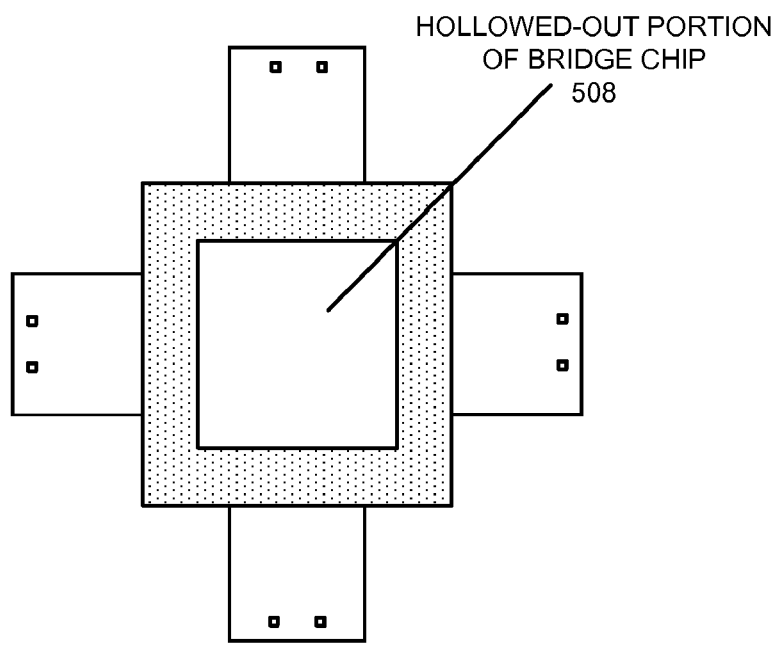
FIG. 5B illustrates the top view of a bridge chip after thinning in accordance with an embodiment of the present invention.

FIG. 5B illustrates the top view of a bridge chip after thinning. The etched portions 502 of the bridge chip have been removed, leaving a hollowed-out area in the center of the bridge chip 508. Note that thinning can occur before bonding, after bonding, or both before and after bonding. The rigid bridge chip can be handled and bonded easily when the bonding is performed before major thinning.

Figure 6A:
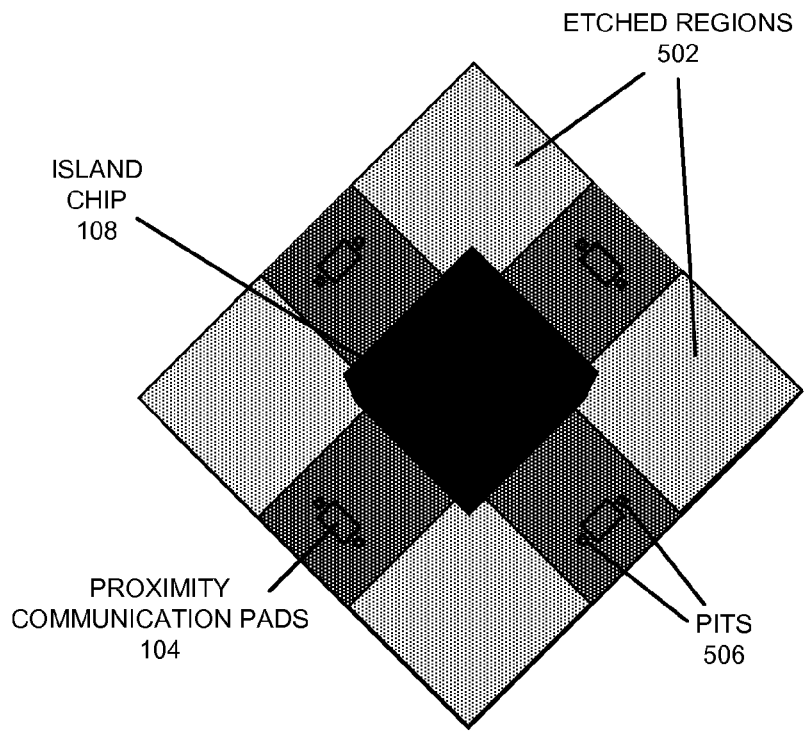
FIG. 6A illustrates a top view of the island chip and the etched regions of the bridge chip before thinning in accordance with an embodiment of the present invention.
Figures 6B, 6C:
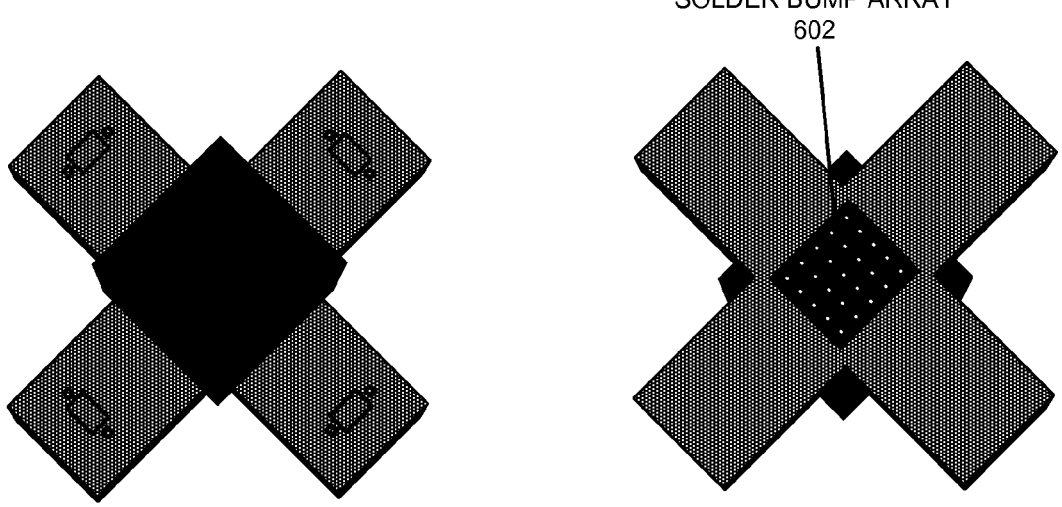
FIG. 6B illustrates the top view of the bridge chip and island chip after thinning in accordance with an embodiment of the present invention.
FIG. 6C illustrates a bottom view of the bridge chip and island chip after thinning in accordance with an embodiment of the present invention.

FIGS. 6A-6C illustrate a bridge chip bonded to an island chip before thinning. FIG. 6A illustrates a top view of the island chip and the etched regions 502 of the bridge chip before thinning. The bridge chip can be thinned to an arbitrary thickness, depending on the specified or desired depth of the features of the bridge chip. FIG. 6B illustrates the top view of the bridge chip and island chip after thinning. FIG. 6C illustrates a bottom view of the bridge chip and island chip after thinning. Note that the hollowed-out portion of the bridge chip 508 exposes a portion of the active face of the island chip.

Since the etched portions of the bridge chip to be removed are thinner than the area of the bridge chip that the island chip is bonded to, the process of thinning the bridge chip does not reach or damage the exposed active face of the island chip. Furthermore, after thinning, the exposed active face of the island chip can be used to attach the island chip to a communication mechanism such as an optical fiber or a rigid-flex cable or to attach the island chip to a second level package (step 414) using a solder bump array 602 that protrudes past the bridge chip. Processing a chip in a way that adds proximity communication functionality while exposing areas on the chip so that industry-standard processes can be used on the center of the chip to enable a wide range of functionality. Potential applications for this configuration include bonding the island chip to a circuit board, specifying a single island chip to receive optical signals and distribute the data to surrounding chips using proximity communication, and easily adding proximity communication to existing chips without changing the manufacturing process or yield of the original chip. For instance, a host island chip and a bridge chip manufactured using a process amenable to thinning could be bonded to a processor package.

In summary, the techniques in the present invention can be applied to manufacture a bridge chip with a pre-determined amount of compliance that can be bonded to an island chip that provides mechanical support and power to the bridge chip. The compliance in the bridge chip allows the system to maintain a desired target separation between the chips while avoiding handling and reliability issues.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A system for facilitating proximity communication between semiconductor chips, comprising:
    a base chip; and
    a bridge chip;
    wherein the base chip and the bridge chip each include an active face upon which active circuitry and signal pads reside, and a back face opposite the active face;
    wherein the active face of the bridge chip is bonded to the active face of the base chip; and
    wherein an identified portion of the active face of the bridge chip is thinned via etching and is removed by planarizing the back face of the bridge chip, thereby creating a hollowed-out opening in the bridge chip that exposes a portion of the active face of the base chip.

2. The system of claim 1, wherein the back face of the bridge chip is planarized after the bridge chip is bonded to the base chip.

3. The system of claim 1, wherein the back face of the bridge chip is planarized before the bridge chip is bonded to the base chip.

4. The system of claim 1, wherein the active face of the base chip communicates with a third device through the opening in the bridge chip.

5. The system of claim 4, wherein the active face of the base chip receives power and ground through the opening and optionally communicates with other devices through the opening using:
    a solder bump array;
    an optical fiber; and/or
    a rigid-flex cable;
    a ceramic substrate;
    an organic substrate; and/or
    a silicon substrate.

6. The system of claim 1, wherein planarizing the back face of the base chip increases the compliance of the portion of the bridge chip used for proximity communication.

7. The system of claim 6, wherein a pit etched in the bridge chip facilitates alignment with a neighboring chip for proximity communication.

8. A computer system that includes:
    a processor coupled to a memory;
    a base chip; and
    a bridge chip;
    wherein the base chip and the bridge chip each include an active face upon which active circuitry and signal pads reside, and a back face opposite the active face;
    wherein the active face of the bridge chip is bonded to the active face of the base chip; and
    wherein an identified portion of the active face of the bridge chip is thinned via etching and is removed by planarizing the back face of the bridge chip, thereby creating a hollowed-out opening in the bridge chip that exposes a portion of the active face of the base chip.

9. The computer system of claim 8, wherein the processor or the memory is the base chip.

* * * * *